(12) United States Patent
Moscatelli (10) Patent No.: US 6,246,348 B1
(45) Date of Patent: Jun. 12, 2001

(54) DEVICE FOR CONVERTING MULTIPLE SIGNAL TYPES TO NRZ FORMAT WITH AUTOMATIC SELF-TEST

(75) Inventor: Steven R. Moscatelli, Bowie, MD (US)

(73) Assignee: The United States of America as represented by the National Security Agency, Washington, DC (US)

(*) Notice: Subject to any disclaimer, the term of this patent is extended or adjusted under 35 U.S.C. 154(b) by 0 days.

(21) Appl. No.: 09/513,739

(22) Filed: Feb. 23, 2000

(51) Int. Cl.[7] ........................................... H03M 5/06
(52) U.S. Cl. ............................ 341/68; 341/59; 341/69
(58) Field of Search ................................ 341/68, 69, 65, 341/67, 141, 142, 120, 100, 59, 61; 370/15; 360/41

(56) References Cited

U.S. PATENT DOCUMENTS

| | | | |
|---|---|---|---|
| 4,393,492 | * 7/1983 | Bishop | 370/15 |
| 5,113,186 | 5/1992 | Remson . | |
| 5,248,969 | 9/1993 | Lee et al. . | |
| 5,657,017 | 8/1997 | Snelgrove . | |
| 5,699,061 | * 12/1997 | Shimpuku | 341/59 |
| 5,786,950 | * 7/1998 | Zook et al. | 360/41 |
| 5,892,797 | 4/1999 | Deng . | |

* cited by examiner

Primary Examiner—Brian Young
Assistant Examiner—John B Nguyen
(74) Attorney, Agent, or Firm—Robert D. Morelli (57) ABSTRACT

The present invention is a device for converting an input signal of various formats to NRZ format in a user-selectable format with automatic self-testing, that includes at least one first channel, where each first channel includes a comparator, an activity detector, an inverter, and a driver circuit, where the comparator is configured for different signal types; at least one second channel, where each second channel includes a transformer, a digitizer, an activity detector, a decoder, a framer, a clock and data recovery circuit, a first driver circuit, and a second driver circuit, having an input connected to the second output of the clock and data recovery circuit, and having an output; at least one third channel, where each third channel includes a transformer, a digitizer, an activity detector, a decoder, a clock and data recovery circuit, a first driver circuit, and a second driver circuit; at least one fourth channel, where each fourth channel includes a transformer, a fanout circuit, a digitizer, an activity detector, a serial to parallel converter, a decoder, a clock and data recovery circuit, at least one first driver circuit, and at least one a second driver circuit; a controller; a multiplexer; a demultiplexer; a comparator array; and a lamp array.

10 Claims, 6 Drawing Sheets

DEVICE FOR CONVERTING MULTIPLE SIGNAL TYPES TO NRZ FORMAT WITH AUTOMATIC SELF-TEST

FIELD OF THE INVENTION

The present invention relates, in general, to coded data generation or conversion and, in particular, to converting signals to NRZ format.

BACKGROUND OF THE INVENTION

Signals are transmitted in a wide range of formats, voltage levels, and speeds (e.g., digital, analog, TTL, MECL, T1, fiber optic, etc.). A signal in one format may be incompatible with a signal in another. Therefore, different procedures may be required to process different signal formats. Different procedures may require the use of different processing equipment. Such equipment may be expensive, and the operator may be required to receive extensive training in order to be able to operate the equipment.

U.S. Pat. No. 5,113,186, entitled "APPARATUS FOR CONVERTING AN ALTERNATE MARK INVERSION SIGNAL TO UNIPOLAR SIGNALS WITH FREQUENCY DEPENDENT AMPLIFICATION," discloses a device for converting an alternate mark inversion (AMI) signal into three different unipolar signals. An AMI signal has three logic levels (i.e., a reference level, a logic one level which is a voltage above the reference level, and a logic zero level which is a voltage below the reference level. The device of U.S. Pat. No. 5,113,186 provides a first signal consisting of the logic one components of an AMI signal, a second signal consisting of the logic zero components of the AMI signal where the logic zero level is converted to the logic one level, and a third signal consisting of both the logic one levels and the logic zero levels of the AMI signal where the logic zero level is converted to the logic one level. U.S. Pat. No. 5,113,186 does not process multiple signals as does the present invention and does not include the other features of the present invention. U.S. Pat. No. 5,113,186 is hereby incorporated by reference into the specification of the present invention.

U.S. Pat. No. 5,248,969, entitled "PHASE COMPARING AND CMI/NRZ DECODING APPARATUS," discloses a device for producing a clock pulse at the center of the CMI data. U.S. Pat. No. 5,248,969 does not process multiple signals as does the present invention and does not include the other features of the present invention. U.S. Pat. No. 5,248,969 is hereby incorporated by reference into the specification of the present invention.

U.S. Pat. No. 5,657,017, entitled "TELEMETRY BI-PHASE-LEVEL TO NON-RETURN-TO-ZERO-LEVEL SIGNAL CONVERTER," discloses a device for converting an RZ signal to an NRZ signal. U.S. Pat. No. 5,657,017 does not process multiple signals as does the present invention and does not include the other features of the present invention. U.S. Pat. No. 5,657,017 is hereby incorporated by reference into the specification of the present invention.

U.S. Pat. No. 5,892,797, entitled "SYSTEM AND METHOD FOR RECOVERING DATA ENCODED USING MANCHESTER CODE AND OTHER BI-PHASE LEVEL CODES," discloses a device for and method of recovering a data signal and a clock signal from a data signal encoded in a digital code. U.S. Pat. No. 5,892,797 does not process multiple signals as does the present invention and does not include the other features of the present invention. U.S. Pat. No. 5,892,797 is hereby incorporated by reference into the specification of the present invention.

SUMMARY OF THE INVENTION

It is an object of the present invention to convert each of a multitude of data signals to NRZ format in one of a user-selectable output-signal formats.

It is an object of the present invention to convert each of a multitude of data signals to NRZ format in one of a user-selectable output-signal formats while doing a periodic test of the operation of the present invention.

It is another object of the present invention to convert each of a multitude of data signals to NRZ format in one of a user-selectable signal formats, where the data signal is selected from the group of signal types consisting of RS232, RS422, sine wave, analog, TTL, LVDS, MECL, PECL, T1, E1, T2, E2, T1C, T3, E3, STM-1, E4, CMI, OC3, and fiber optic.

It is another object of the present invention to convert each of a multitude of data signals to NRZ format in one of a user-selectable output-signal formats, where the output-signal format is selected from the group of output-signal formats consisting of RS422, TTL, LVDS, ECL, MECL, PECL, and DECL.

The present invention is a device for converting data signals of various formats to NRZ format in a user-selectable output-signal format with automatic self-testing. The device 1 at least one first channel, at least one second channel, at least one third channel, and at least one fourth channel.

The first channel processes data signals in the RS232, RS422, sine wave, analog, TTL, LVDS, MECL, and PECL formats.

The first channel includes a first input and second input for receiving an input signal or a test signal, a first control input for inverting or not inverting the input signal, a second control input for selecting the type of output format to which the input signal will be converted, a first output for indicating whether or not there is any activity in the first channel, and a second output for transmitting data extracted from the input signal in a format selected using the second control input. Due to differences in voltage levels or operating speeds between the signals that may be processed by the first channel, five different input configurations are used.

The second channel, which processes T1 and E1 signals, includes an input for receiving an input signal or a test signal, a control input for selecting the type of output format to which the input signal will be converted, a first output for indicating whether or not there is any activity in the second channel, a second output for transmitting data extracted from the input signal in a format selected using the control input, and a third output for transmitting a clock signal extracted from the input signal in a format selected using the control signal.

The third channel, which processes T2, E2, T1C, T3, E3, and STM-1 signals, includes an input for receiving an input signal or a test signal, a control input for selecting the type of output format to which the input signal will be converted, a first output for indicating whether or not there is any activity in the third channel, a second output for transmitting data extracted from the input signal in a format selected using the control input, and a third output for transmitting a clock signal extracted from the input signal in a format selected using the control signal.

The fourth channel, which processes E4, CMI, OC3, and electronic versions of fiber optic signals, includes an input for receiving an input signal or a test signal, a control input for selecting the type of output format to which the input signal will be converted, a first output for indicating whether or not there is any activity in the fourth channel, at least one second output for transmitting data extracted from the input signal in a format selected using the control input, at least one third output for transmitting a clock signal extracted from the input signal in a format selected using the control signal, and at least one fourth output at which appears a copy of the input signal as received.

For performing periodic self-testing, the present invention includes a controller, a multiplexer, a demultiplexer, and a comparator array.

Each first channel includes a comparator, an activity detector, an inverter, and a driver circuit. The comparator inputs for each first channel are configured for the type of signal received thereby.

Each second channel includes a transformer, a digitizer, an activity detector, a decoder, a framer, a clock and data recovery circuit, a first driver circuit, and a second driver circuit.

Each third channel includes a transformer, a digitizer, an activity detector, a decoder, a clock and data recovery circuit, a first driver circuit, and a second driver circuit.

Each fourth channel includes a transformer, a fanout circuit, a digitizer, a serial-to-parallel converter, a decoder, a clock and data recovery circuit, and a driver circuit for each output of the clock and data recovery circuit.

DETAILED DESCRIPTION

The present invention is a device for converting data signals of various formats to NRZ format in a user-selectable output-signal format with automatic self-testing.

Figure 1:
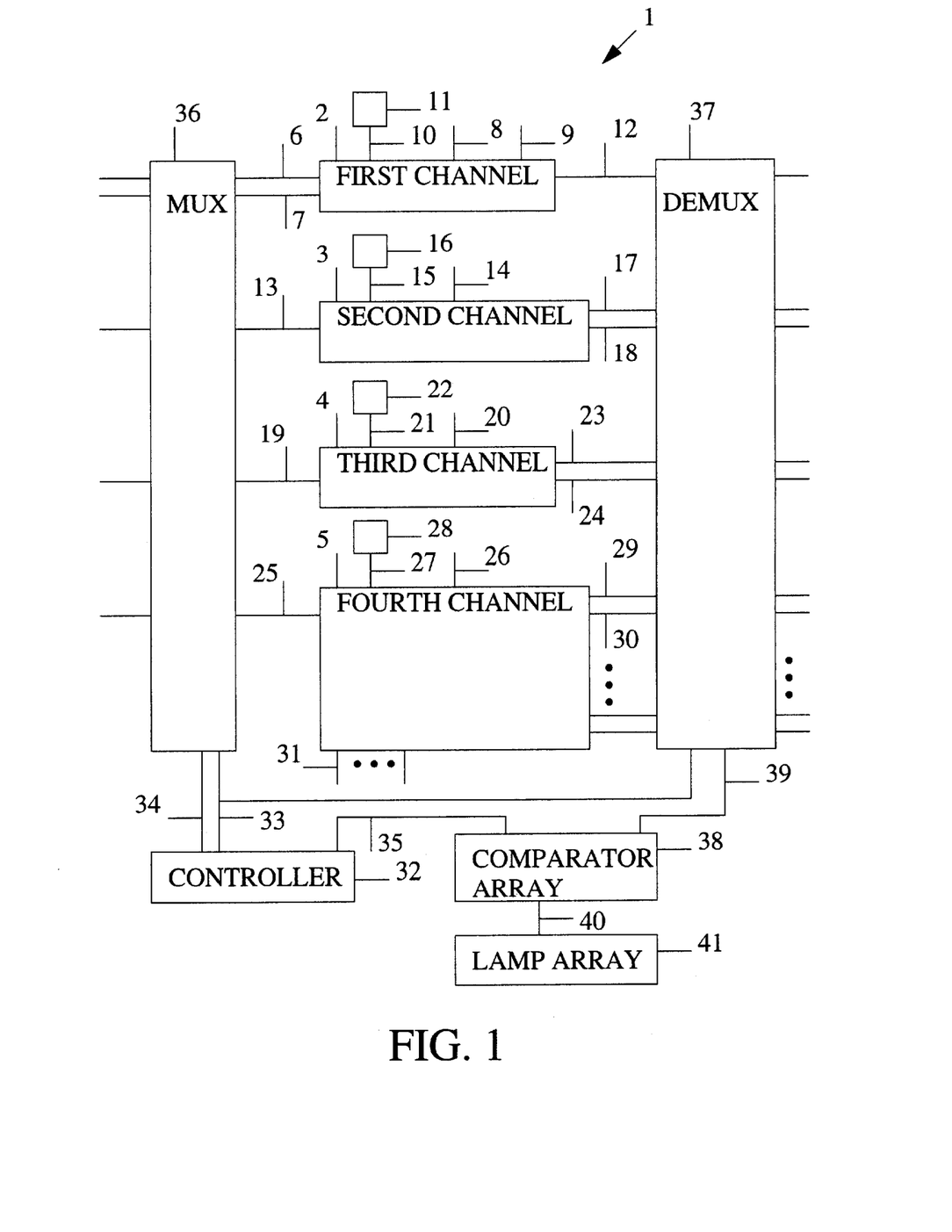
FIG. 1 is a schematic of the present invention.

FIG. 1 is a schematic of the device 1 of the present invention. The device 1 includes at least one first channel 2, at least one second channel 3, at least one third channel 4, and at least one fourth channel 5.

The first channel 2 processes data signals in the following formats: RS232, RS422, sine wave, analog, TTL, LVDS, MECL, and PECL. The details of the first channel 2 are discussed below and illustrated in FIG. 2.

The first channel 2 includes a first input 6 and a second input 7 for receiving an input signal or a test signal. The first channel 2 also has a first control input 8 for inverting or not inverting the input signal. The first channel 2 also has a second control input 9 for selecting the type of output format to which the input signal will be converted. The first channel 2 also has a first output 10 for indicating whether or not there is any activity in the first channel 2 (i.e., is the first channel two processing an input signal?). The first output 10 is connected to a lamp 11 to indicate visually that activity is taking place in the first channel 2. The first channel 2 also has a second output 12 for transmitting data extracted from the input signal in a format selected using the second control input 9.

The signals processed by the first channel 2 may exhibit differences in voltage level or operating speed. Therefore, the inputs of one instance of the first channel 2 may be slightly different than the inputs of another. The differences in voltage level or operating speed require the use of a first type of input configuration to process RS232, sine wave, and analog signals; a second, to process RS422 and LVDS signals; a third, to process TTL signals; a fourth, to process MECL signals; and a fifth, to process PECL signals. The first through fifth input configuration types are illustrated in FIGS. 3–7, respectively.

The second channel 3 processes T1 and E1 signals. The details of the second channel 3 are discussed below and illustrated in FIG. 8.

The second channel 3 includes an input 13 for receiving an input signal or a test signal. The second channel 3 also has a control input 14 for selecting the type of output format to which the input signal will be converted. The second channel 3 also has a first output 15 for indicating whether or not there is any activity in the second channel 3. The first output 15 is connected to a lamp 16 to indicate visually that activity is taking place in the second channel 3. The second channel 3 also has a second output 17 for transmitting data extracted from the input signal in a format selected using the control input 14. The second channel 3 also has a third output 18 for transmitting a clock signal extracted from the input signal in a format selected using the control signal 14.

Figure 8:
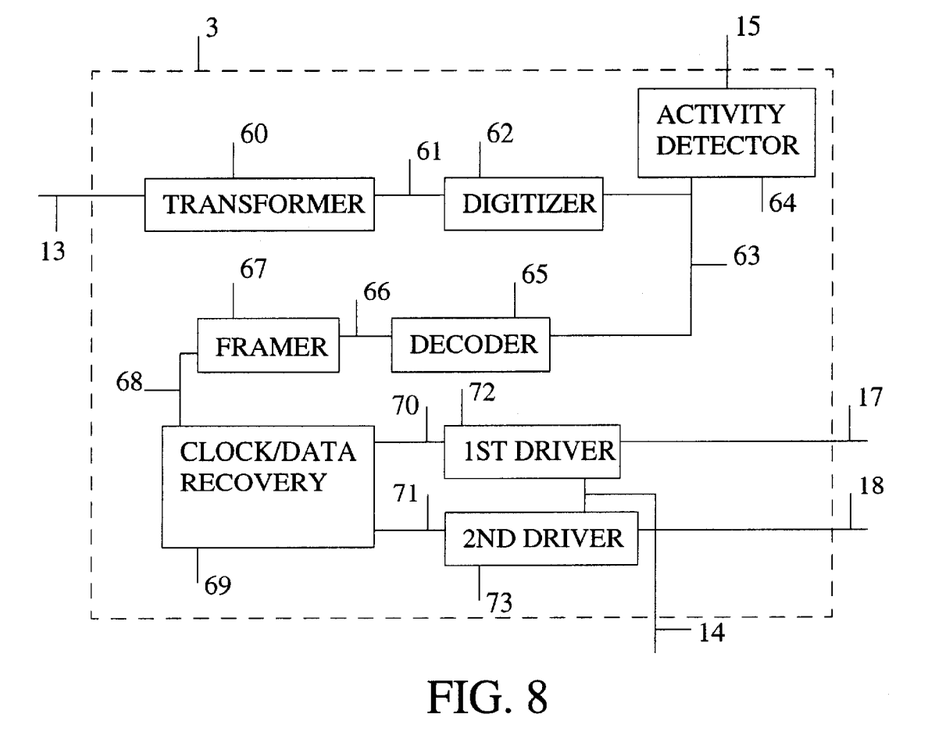
FIG. 8 is a schematic of the second channel of FIG. 1.

The top-level block diagram for the second channel 3 which is illustrated in FIG. 8 is the same for processing a T1 signal or an E1 signal, but differences between the formats of these signals may require modification to the internal workings of some of the block diagrams. A person skilled in the art knows how to make such a modification.

The third channel 4 processes T2, E2, T1C, T3, E3, and STM-1 signals. The details of the third channel 4 are discussed below and illustrated in FIG. 9.

The third channel 4 includes an input 19 for receiving an input signal or a test signal. The third channel 4 also has a control input 20 for selecting the type of output format to which the input signal will be converted. The third channel 4 also has a first output 21 for indicating whether or not there is any activity in the third channel 4. The first output 21 is connected to a lamp 22 to indicate visually that activity is taking place in the third channel 4. The third channel 4 also has a second output 23 for transmitting data extracted from the input signal in a format selected using the control input 20. The third channel 4 also has a third output 24 for transmitting a clock signal extracted from the input signal in a format selected using the control signal 20.

Figure 9:
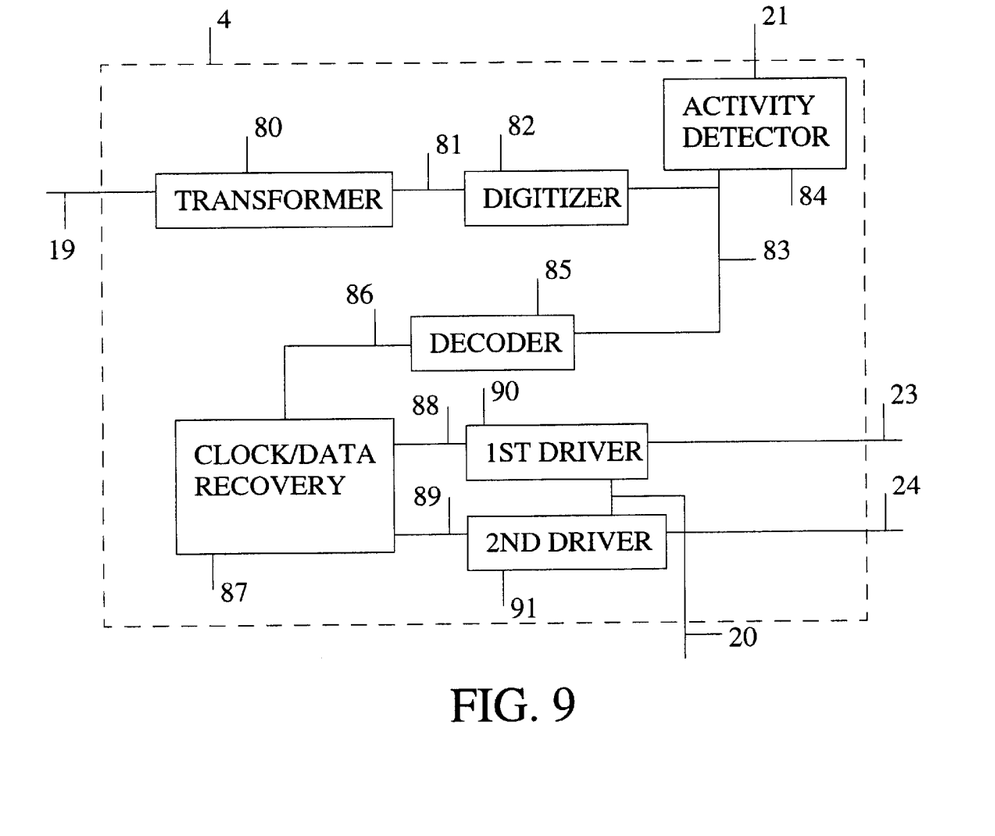
FIG. 9 is a schematic of the third channel of FIG. 1.

The top-level block diagram for the third channel 4 which is illustrated in FIG. 9 is the same for processing a T2, E2, T1C, T3, E3, or STM-1 signal, but differences between the formats of these signals may require modification to the internal workings of some of the block diagrams. A person skilled in the art knows how to make such a modification.

The fourth channel 5 processes E4, CMI, OC3, and fiber optic signals. The fiber optic signal must first be converted from an optical signal to an electrical one. The details of the fourth channel 5 are discussed below and illustrated in FIG. 10.

The fourth channel 5 includes an input 25 for receiving an input signal or a test signal. The fourth channel 5 also has a control input 26 for selecting the type of output format to which the input signal will be converted. The fourth channel 5 also has a first output 27 for indicating whether or not there is any activity in the fourth channel 5. The first output 27 is connected to a lamp 28 to indicate visually that activity is taking place in the fourth channel 5. The fourth channel 5 also has at least one second output 29 for transmitting data extracted from the input signal in a format selected using the control input 26. The fourth channel 5 also has at least one third output 30 for transmitting a clock signal extracted from the input signal in a format selected using the control signal 26. The number of pairs of second outputs 29 and third outputs 30 indicate the degree of parallelism to which the input signal was divided. For example, if there are two pairs of second outputs 29 and third outputs 30 then that indicates that the input signal was divided in half. This also means that the speed of the second outputs 29 and the third outputs 30 are half as fast as the speed of the input signal. The more parallelism that is used in the second outputs 29 and the third outputs 30 of the fourth channel 5 the more the clock speed of the input signal is reduced. This is useful for transmitting very fast input signals to processing equipment that, otherwise, would not be able to process very fast signals. The fourth channel 5 also includes at least one fourth output 31 at which appears a copy of the input signal as received. Including at least one fourth output 31 allows the user to split an input signal into as many copies as the user desires. Such splitting facilitates parallel processing in one or a number of different ways.

Figure 10:
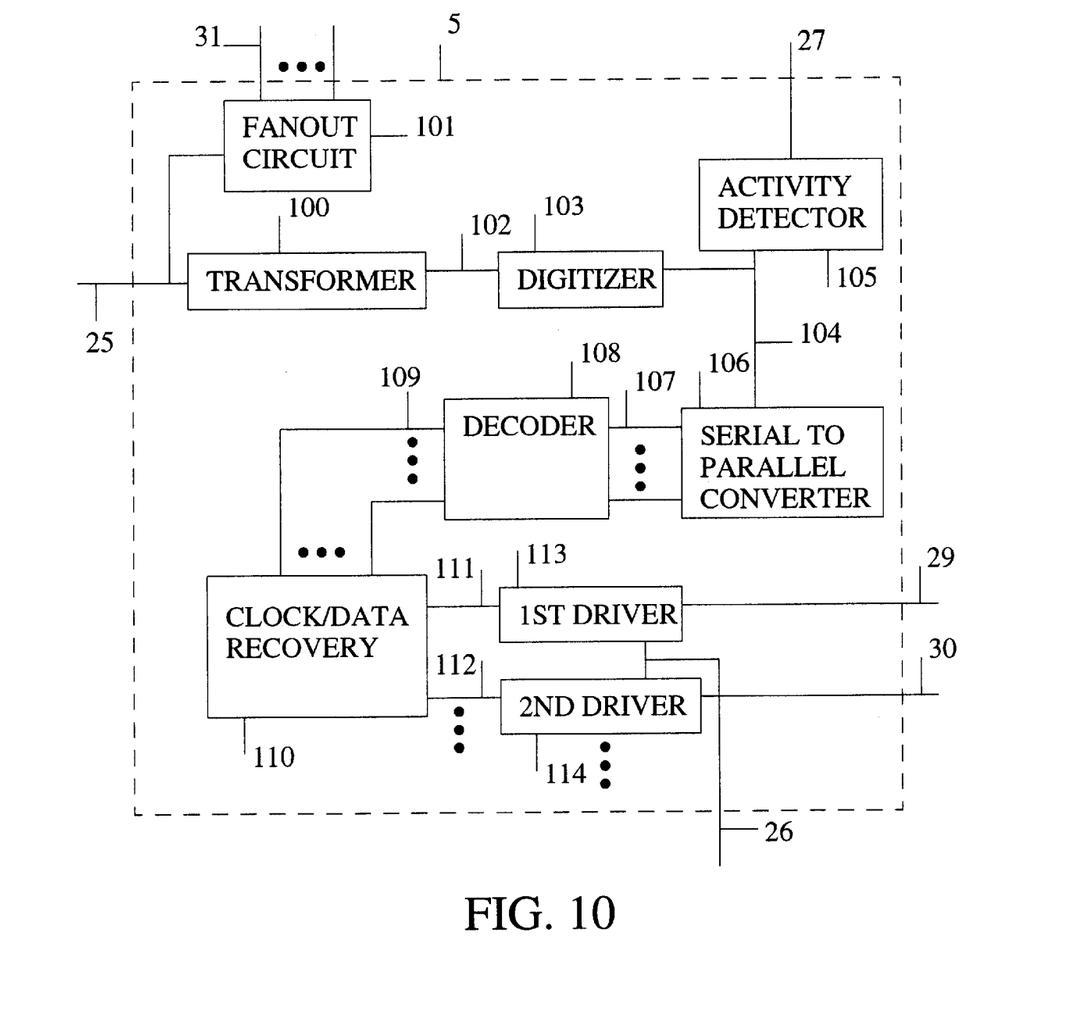
FIG. 10 is a schematic of the fourth channel of FIG. 1.

The top-level block diagram for the fourth channel 5 which is illustrated in FIG. 10 is the same for processing an E4, CMI, OC3, or electrically-converted fiber optic signal, but differences between the formats of these signals may require modification to the internal workings of some of the block diagrams. A person skilled in the art knows how to make such a modification.

The device 1 includes a controller 32 for periodically testing the device 1. Devices that may be used to realize the controller 32 include commercially available controller devices, microprocessors, finite state machines, application specific logic devices, and discrete logic. The controller 32 includes a control output 33, a first signal output bus 34, and a second signal output bus 35. The control output 33 is connected to a multiplexer 36 and a demultiplexer 37. Devices that may be used to realize the multiplexer 36 and the demultiplexer 37 include commercially available multiplexer, demultiplexers, and discrete logic. The first signal output bus 34 is connected to the multiplexer 36. The second signal output bus 35 is connected to a set of first inputs to a comparator array 38. The comparator 38 may be realized by commercially available comparators, application specific logic devices, and discrete logic. The multiplexer 36 also receives input signals to be processed by the device 1. The outputs of the multiplexer 36 are connected to the appropriate channel of the device 1. The outputs of the channels are connected to the demultiplexer 37. The outputs of the demultiplexer 37 are connected to a second input bus 39 to the comparator array 38. The comparator array 38 includes an output array 40 at which appears signals that indicates whether or not the corresponding pairs of signals received by the comparator array 38 match. A lamp array 41 is connected to the output array 40 to visually indicate whether or not each channel is operating properly. The lamp array 40 may be realized by commercially available lamp arrays and discrete lamps.

Automatic self-testing of the device 1 begins when the controller 32 periodically commands the multiplexer 36, via the control output 33, to transmit test signals stored therein, via the first output bus 34, to the appropriate channels rather than input signals. In an alternate embodiment, the controller 32 may include a test input by which a user may command the device 1 at a user-definable time to go into test mode. The controller 32 also contains signals that represent what each test signal should look like if it were processed correctly by the appropriate channel in the device 1. These representations of correctly processed signals are sent to the first set of inputs to the comparator array 38 via the second output bus 35. After the device 1 processes all of the test signals, the demultiplexer 37, under control of the control output 33 of the controller 32, transmits the processed signals to the second input bus 39 of the comparator array 38. The comparator array 38 then compares the appropriate output of the device 1 with the appropriate expected output stored in the controller 32 and indicates whether or not a match has occurred via the output array 40. The lamp array 41 connected to the output array 40 indicates visually whether or not each channel of the device 1 is operating properly. The output array 40 may be latched so that the lamp array 41 provides a continuous output until the next self-test is done.

Figure 2:
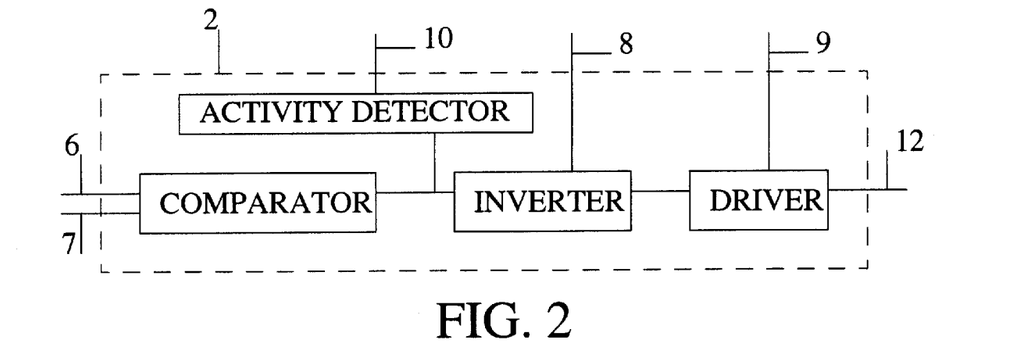
FIG. 2 is a schematic of the first channel of FIG. 1.

FIG. 2 is a schematic of each first channel 2 of FIG. 1. The first input 6 is connected to a positive terminal of a comparator 50. The comparator 50 may be realized by a commercially available comparator. The second input 7 is connected to a negative terminal of the comparator 50. The output 51 of the comparator 50 is connected to an activity detector 52. The activity detector 52 may be realized by a commercially available activity detector, an application specific logic device, and discrete logic. If there is any activity on the output 51 of the comparator 50 that indicates that the first channel 2 is processing a signal then the output 10 of the activity detector 52 indicates so with an appropriate output signal (e.g., a logic 1). The output 51 of the comparator 50 is also connected to an inverter 53. The inverter 53 may be realized by a commercially available inverter, an application specific logic device, and discrete logic. The inverter 53, under control of the first control input 8, either inverts the output of the comparator 50 or leaves it the same. The inverter is useful for changing the trigger edge on which the signal will be processed (e.g., positive-edge or negative-edge). The output 54 of the inverter 53 is connected to a driver circuit 55. The driver circuit 55 may be realized by a commercially available driver circuit, an application specific logic device, and discrete logic. The driver circuit 55, under control of the second control input 9, converts the signal to one of a number of signal types for driving other processing equipment (e.g., digital computers) that may be used to process the signal. The signal type to which the signal being process by the first channel 2 may be converted includes RS422, TL, ECL, MECL, PECL, DECL, or LVDS.

Figure 3:
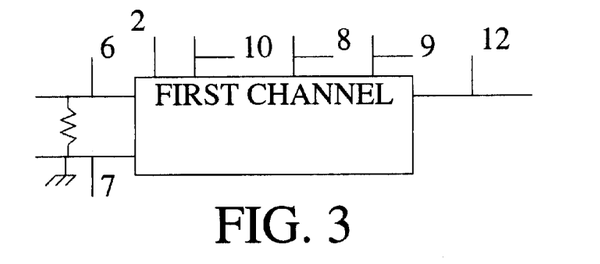
FIG. 3 is a schematic of a first input configuration type for FIG. 1.

FIG. 3 is a schematic of the first input configuration type of the comparator 50 of FIG. 2. The first input configuration type is used to process RS232, sine wave, and analog signals. A resistor is connected between the first input 6 and the second input 7. The second input 7 is also connected to a ground potential.

Figure 4:
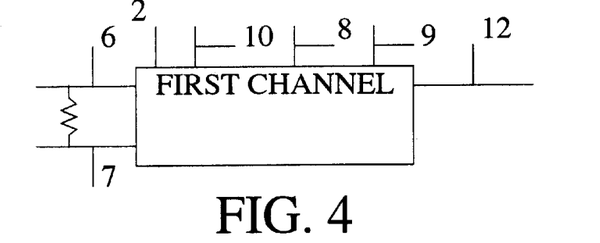
FIG. 4 is a schematic of a second input configuration type for FIG. 1.

FIG. 4 is a schematic of the second input configuration type of the comparator 50 of FIG. 2. The second input configuration type is used to process LVDS and RS422 signals. A resistor is connected between the first input 6 and the second input 7.

Figure 5:
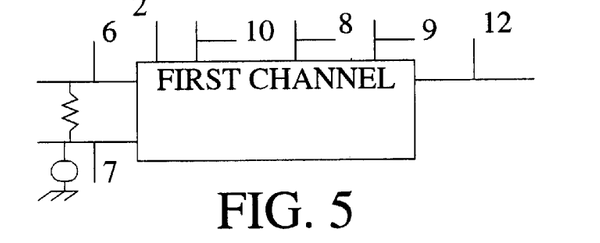
FIG. 5 is a schematic of a third input configuration type for FIG. 1.

FIG. 5 is a schematic of the third input configuration type of the comparator 50 of FIG. 2. The third input configuration type is used to process TTL signals. A resistor is connected between the first input 6 and the second input 7. The second input 7 is also connected to a user-definable voltage potential which sets the logic threshold for any signal received. The voltage potential may be set by a voltage source or a voltage divider.

Figure 6:
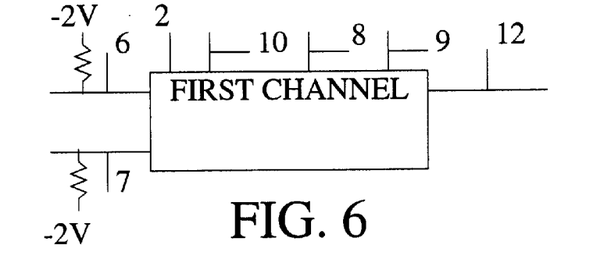
FIG. 6 is a schematic of a fourth input configuration type for FIG. 1.

FIG. 6 is a schematic of the fourth input configuration type of the comparator 50 of FIG. 2. The fourth input configuration type is used to process MBCL signals. A resistor is connected from the first input 6 to a −2V potential. The second input 7 is also connected by a resistor to a −2V potential.

Figure 7:
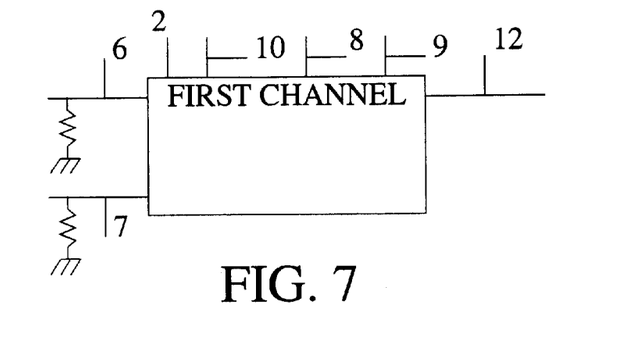
FIG. 7 is a schematic of a fifth input configuration type for FIG. 1.

FIG. 7 is a schematic of the fifth input configuration type of the comparator 50 of FIG. 2. The fifth input configuration type is used to process PECL signals. A 320 ohm resistor is connected from the first input 6 to a ground potential. The second input 7 is also connected by a 320 ohm resistor to a ground potential.

FIG. 8 is a schematic of each second channel 3 of the device 1 of FIG. 1. The second channel 3 is used to process T1 and E1 signals. The signal to be processed is received at the input 13 of a transformer 60 in FIG. 8. The transformer 60 may be realized by a commercially available transformer and discrete devices. The transformer 60 transforms the input signal to an analog signal in the range of +/−5V. The output 61 of the transformer 60 is connected to a digitizer 62. The digitizer 62 may be realized by a commercially available digitizer and discrete devices. The digitizer 62 converts the output of the transformer 60 to its constituent logic values. The output 63 of the digitizer 62 is connected to an activity detector 64 and a decoder 65. The activity detector 64 and the decoder 65 may each be realized by commercially available devices, application specific logic devices, and discrete devices. The activity detector 64 determines whether or not there is activity on the output 63 of the digitizer 62 that indicates that the second channel 3 is processing a signal and indicates so on the output 15 of the activity detector 64. The decoder 65 converts the output of the digitizer 63 to Alternate Mark Indicator (AMI) format. The output 66 of the decoder 65 is connected to a framer 67. The framer 67 may be realized with a commercially available framer, an application specific logic device, and discrete devices. The framer 67 adds channel markers to the AMI signal in order to facilitate the processing of the AMI signal in frames. The output 68 of the framer 67 is connected to a clock and data recovery circuit 69. The clock and data recovery circuit 69 may be realized with a commercially available clock and data recovery circuit, an application specific logic device, and discrete devices. The clock and data recovery circuit 69 recovers the clock signal of the AMI signal and separates it from the data of the AMI signal. The data of the AMI signal in NRZ format appears at the first output 70 of the clock and data recovery circuit 69. The clock of the AMI signal in NRZ format appears at the second output 71 of the clock and data recovery circuit 69. The first output 70 of the clock and data recovery circuit 69 is connected to a first driver circuit 72. The first driver circuit 72 may be realized with a commercially available driver circuit, an application specific circuit, and discrete devices. The first driver circuit 72, under control of the control input 14, converts the signal to one of a number of signal types for driving other processing equipment (e.g., digital computers) that may be used to process the signal. The signal being process by the second channel 3 may be converted to RS422, TTL, ECL, MECL, PECL, DECL, or LVDS. The data from the signal processed by the second channel 3 appears in NRZ format in a user-definable format at the output 17 of the first driver circuit 72. The second output 71 of the clock and data recovery circuit 69 is connected to a second driver circuit 73. The second driver circuit 73 is identical to the first driver circuit 72. The control input of the second driver circuit 73 is connected to the control input 14 of the first driver circuit 72. The clock signal of the signal being processed by the second channel 3 appears in NRZ format in a user-definable format at the output 18 of the second driver circuit 73.

FIG. 9 is a schematic of each third channel 4 of the device 1 of FIG. 1. The third channel 4 is used to process T2, E2, T1C, T3, E3, and STM-1 signals. The signal to be processed is received at the input 19 of a transformer 80 in FIG. 9. The transformer 80 transforms the input signal to an analog signal in the range of +/−5V. The output 81 of the transformer 80 is connected to a digitizer 82. The digitizer 82 converts the output of the transformer 80 to its constituent logic values. The output 83 of the digitizer 82 is connected to an activity detector 84 and a decoder 85. The activity detector 84 determines whether or not there is activity on the output 83 of the digitizer 82 that indicates that the third channel 4 is processing a signal and indicates so on the output 21 of the activity detector 84. The decoder 85 converts the output of the digitizer 83 to AMI format. The output 86 of the decoder 85 is connected to a clock and data recovery circuit 87. The clock and data recovery circuit 87 recovers the clock signal of the AMI signal and separates it from the data of the AMI signal. The data of the AMI signal in NRZ format appears at the first output 88 of the clock and data recovery circuit 87. The clock of the AMI signal in NRZ format appears at the second output 89 of the clock and data recovery circuit 87. The first output 88 of the clock and data recovery circuit 87 is connected to a first driver circuit 90. The first driver circuit 90, under control of the control input 20, converts the signal to one of a number of signal types for driving other processing equipment (e.g., digital computers) that may be used to process the signal. The signal being process by the third channel 4 may be converted to RS422, TML, ECL, MECL, PECL, DECL, or LVDS. The data from the signal processed by the third channel 4 appears in NRZ format in a user-definable format at the output 23 of the first driver circuit 90. The second output 89 of the clock and data recovery circuit 87 is connected to a second drivercircuit 91. The second driver circuit 91 is identical to the first driver circuit 90. The control input of the second driver circuit 91 is connected to the control input 20 of the first driver circuit 90. The clock signal of the signal being processed by the third channel 4 appears in NRZ format in a user-definable format at the output 24 of the second driver circuit 91.

FIG. 10 is a schematic of each fourth channel 5 of the device 1 of FIG. 1. The fourth channel 5 is used to process E4, CMI, OC3, and electronic versions of fiber optic signal. The signal to be processed is received at the input 25 of a transformer 100 in FIG. 10. The input 25 of the transformer 100 is also connected to a fanout circuit 101. The fanout circuit 101 may be realized by a commercially available fanout circuit, an application specific device, and discrete devices. The fanout circuit 101 provides a plurality of copies of the input signal, appearing at the input 25 of the transformer 100, at a plurality of outputs 31 of the fanout circuit 101. The transformer 100 transforms the input signal to an analog signal in the range of +/−5V. The output 102 of the transformer 100 is connected to a digitizer 103. The digitizer 103 converts the output of the transformer 100 to its constituent logic values. The output 104 of the digitizer 103 is connected to an activity detector 105 and a serial-to-parallel converter 106. The serial-to-parallel converter 106 may be realized by a commercially available serial-to-parallel converter, an application specific device, and discrete devices. The activity detector 105 determines whether or not there is activity on the output 104 of the digitizer 103 that indicates that the fourth channel 5 is processing a signal and indicates so on the output 27 of the activity detector 105. The serial-to-parallel converter 106 divides the signal appearing at the output 104 of the digitizer 103 into at least one equal parts which appear at the at least one output 107 of the serial-to-parallel converter 106. Dividing a signal in this way allows the processing components that receive such a divided signal to operate at a lower clock frequency and avoid the expense of obtaining new processing equipment every time the clock frequency of a signal is increased beyond the clock frequency of the processing equipment. The at least one output 107 of the serial-to-parallel converter 107 is connected to a decoder 108. The decoder 108 converts each part of the signal presented thereto by the serial-to-parallel converter 106 to AMI format. The at least one outputs 109 of the decoder 108 is connected to a clock and data recovery circuit 110. The clock and data recovery circuit 110 recovers, for each signal part presented thereto, the clock signal of the AMI signal and separates it from the data of the AMI signal. For each signal part presented to the clock and data recovery circuit 110, a pair of outputs 111 and 112 appears at the output of clock a data recovery circuit 110. The data of one part of the AMI signal in NRZ format appears at one of the outputs of the pair 111. The clock of the same part of the AMI signal in NRZ format appears at the another of the outputs of the pair 112. The first output of a pair 111 of the clock and data recovery circuit 110 is connected to one of at least one first driver circuit 113. The at least one first driver circuit 113, under control of the control input 26, converts the signal to one of a number of signal types for driving other processing equipment (e.g., digital computers) that may be used to process the signal. The signal being process by the fourth channel 5 may be converted to RS422, TTL, ECL, MECL, PECL, DECL, or LVDS. The data from each signal part processed by the fourth channel 5 appears in NRZ format in a user-definable format at the output 29 of the first driver circuit 113. The second output of a pair 112 of the clock and data recovery circuit 110 is connected to one of at least one second driver circuit 114. The at least one second driver circuit 114 is identical to the at least one first driver circuit 113. The control input of the at least one second driver circuit 114 is connected to the control input 26 of the at least one first driver circuit 113. The clock signal of a signal part being processed by the fourth channel 5 appears in NRZ format in a user-definable format at one of the outputs 30 of the at least one second driver circuit 114.

What is claimed is:

1. A device for converting an input signal of various formats to NRZ format in a user-selectable format with automatic self-testing, comprising
   a) at least one first channel, where each at least one first channel has a first input, a second input, a first control input, a second control input, a first output, and a second output;
   b) at least one second channel, where each at least one second channel has an input, a control input, a first output, a second output, and a third output;
   c) at least one third channel, where each at least one third channel has an input, a control input, a first output, a second output, and a third output;
   d) at least one fourth channel, where each at least one fourth channel has an input, a control input, a first output, at least one second output, at least one third output, and at least one fourth output;
   e) a controller, having a control output, a first output bus, and a second output bus;
   f) a multiplexer, having an input bus, a control input connected to the control output of the controller, and an output bus connected to first input and second input of the first channel, the input of the second channel, the input of the third channel, and the input of the fourth channel;
   g) a demultiplexer, having an input bus connected to the second output of the first channel, the second output and the third output of the second channel, the second output and the third output of the third channel, and the at least one second output and the at least one third output of the fourth channel, having a control input connected to the control output of the controller, and having an output bus;
   h) a comparator array, having a first input bus connected to the output bus of the controller, having a second input bus connected to the output bus of the demultiplexer, and having an output array; and
   i) having a lamp array connected to each first output of the at least one first channel, each first output of the at least one second channel, each first output of the at least one third channel, each first output of the at least one fourth channel, and the output array of the comparator array.

2. The device of claim 1, wherein each of said at least one first channel is comprised of:
   a) a comparator, having a first input, a second input and an output;
   b) an activity detector, having an input connected to the output of the comparator, and having an output;
   c) an inverter, having an input connected to the output of the comparator, having a control input, and having an output; and
   d) a driver circuit, having an input connected to the output of the inverter, having a control input, and having an output.

3. The device of claim 2, further including a resistor having a first end and a second end, where the first end is connected to the first input of the comparator and the second end is connected to the second input of the comparator.

4. The device of claim 2, further including:
   a) a resistor having a first end and a second end, where the first end is connected to the first input of the comparator and the second end is connected to the second input of the comparator; and
   b) a ground potential connected to the second input of the comparator.

5. The device of claim 2, further including:
   a) a resistor having a first end and a second end, where the first end is connected to the first input of the comparator and the second end is connected to the second input of the comparator; and
   b) a voltage source connected to the second input of the comparator.

6. The device of claim 2, further including:
   a) a first resistor having a first end and a second end, where the first end is connected to the first input of the comparator and the second end is connected to −2V; and
   b) a second resistor having a first end and a second end, where the first end is connected to the second input of the comparator and the second end is connected to −2V.

7. The device of claim 2, further including:
   a) a first resistor having a first end and a second end, where the first end is connected to the first input of the comparator and the second end is connected to a ground potential; and b) a second resistor having a first end and a second end, where the first end is connected to the second input of the comparator and the second end is connected to the ground potential.

8. The device of claim 1, wherein each of said second channel is comprised of:

a) a transformer, having an input and an output;

b) a digitizer, having an input connected to the output of the transformer, and having an output;

c) an activity detector, having an input connected to the output of the digitizer, and having an output;

d) a decoder, having an input connected to the output of the digitizer, and having an output;

e) a framer, having an input connected to the output of the decoder, and having an output;

f) a clock and data recovery circuit, having an input connected to the output of the framer, having a first output, and having a second output;

g) a first driver circuit, having an input connected to the first output of the clock and data recovery circuit, and having an output; and h) a second driver circuit, having an input connected to the second output of the clock and data recovery circuit, and having an output.

9. The device of claim 1, wherein each of said third channel is comprised of:

a) a transformer, having an input and an output;

b) a digitizer, having an input connected to the output of the transformer, and having an output;

c) an activity detector, having an input connected to the output of the digitizer, and having an output;

d) a decoder, having an input connected to the output of the digitizer, and having an output;

e) a clock and data recovery circuit, having an input connected to the output of the decoder, having a first output, and having a second output;

f) a first driver circuit, having an input connected to the first output of the clock and data recovery circuit, and having an output; and g) a second driver circuit, having an input connected to the second output of the clock and data recovery circuit, and having an output.

10. The device of claim 1, wherein each of said fourth channel is comprised of:

a) a transformer, having an input and an output;

b) a fanout circuit, having an input connected to the input of the transformer, and having at least one output;

c) a digitizer, having an input connected to the output of the transformer, and having an output;

d) an activity detector, having an input connected to the output of the digitizer, and having an output;

e) a serial to parallel converter, having an input connected to the output of the digitizer, and having at least one output;

f) a decoder, having at least one input connected to the at least one output of the serial to parallel converter, and having at least one output;

g) a clock and data recovery circuit, having at least one input connected to the at least one output of the decoder, having at least one first output, and having at least one second output;

h) at least one first driver circuit, having an input connected to the at least one first output of the clock and data recovery circuit, and having an output; and i) at least one a second driver circuit, having an input connected to the at least one second output of the clock and data recovery circuit, and having an output.

* * * * *